United States Patent
Kwon et al.

(10) Patent No.: US 9,293,519 B2
(45) Date of Patent: Mar. 22, 2016

(54) ORGANIC LIGHT EMITTING DISPLAY

(71) Applicants: Soon-Gi Kwon, Yongin (KR);
Sung-Cheon Park, Yongin (KR)

(72) Inventors: Soon-Gi Kwon, Yongin (KR);
Sung-Cheon Park, Yongin (KR)

(73) Assignee: Samsung Display Co., Ltd.,
Samsung-ro, Giheung-Gu, Yongin-si,
Gyeonggi-Do (KR)

( * ) Notice: Subject to any disclaimer, the term of this patent is extended or adjusted under 35 U.S.C. 154(b) by 95 days.

(21) Appl. No.: 13/923,894

(22) Filed: Jun. 21, 2013

(65) Prior Publication Data

US 2014/0232275 A1 Aug. 21, 2014

(30) Foreign Application Priority Data

Feb. 21, 2013 (KR) ........................ 10-2013-0018613

(51) Int. Cl.
*G09G 5/00* (2006.01)
*H01L 27/32* (2006.01)
*G09G 3/32* (2006.01)

(52) U.S. Cl.
CPC .......... *H01L 27/3279* (2013.01); *G09G 3/3233* (2013.01); *G09G 2300/0426* (2013.01); *G09G 2330/02* (2013.01); *G09G 2330/028* (2013.01)

(58) Field of Classification Search
USPC ............... 345/76, 206, 209, 212, 82, 92, 211, 345/210, 214
See application file for complete search history.

(56) References Cited

U.S. PATENT DOCUMENTS

| | | | | |
|---|---|---|---|---|
| 2004/0257312 | A1* | 12/2004 | Koyama | G09G 3/3225 345/76 |
| 2007/0080917 | A1* | 4/2007 | Koyama | G09G 3/3225 345/92 |
| 2007/0120780 | A1* | 5/2007 | Park et al. | 345/76 |
| 2007/0200804 | A1* | 8/2007 | Kwon | 345/76 |
| 2010/0045646 | A1* | 2/2010 | Kishi | 345/211 |
| 2010/0238149 | A1* | 9/2010 | Kishi et al. | 345/206 |
| 2011/0043505 | A1 | 2/2011 | Ahn et al. | |
| 2013/0235010 | A1* | 9/2013 | Park | 345/209 |
| 2013/0241808 | A1 | 9/2013 | Kwon et al. | |
| 2015/0269887 | A1* | 9/2015 | Liu | G09G 3/3291 345/212 |
| 2015/0294621 | A1* | 10/2015 | Koyama | G09G 3/3225 345/212 |

FOREIGN PATENT DOCUMENTS

| | | |
|---|---|---|
| KR | 10-2008-0050710 | 6/2008 |
| KR | 10-2011-0018782 | 2/2011 |
| KR | 10-2013-0116411 | 10/2013 |

\* cited by examiner

*Primary Examiner* — Thuy Pardo
(74) *Attorney, Agent, or Firm* — Robert E. Bushnell, Esq.

(57) ABSTRACT

An organic light emitting display that includes a display panel, a power supply and a coupling member. The display panel includes scan lines, data lines, first power lines and a plurality of pixels. The power supply is positioned at the outside of the display panel, and supplies first power to the display panel through a coupling member. The coupling member includes first and second coupling portions respectively coupled to the power lines, first and second coupling lines transmitting the first power supplied from the power supply to the respective first and second coupling portions, and a feedback line transmitting the voltage of the second coupling portion to the power supply. Accordingly, it is possible to provide an organic light emitting display capable of precisely controlling the voltage of output power and preventing the deterioration of the luminance of a display panel.

18 Claims, 4 Drawing Sheets

ORGANIC LIGHT EMITTING DISPLAY

RELATED APPLICATIONS

This application makes reference to, incorporates the same herein, and claims all benefits accruing under 35 U.S.C. §119 from an application earlier filed in the Korean Intellectual Property Office on 21 Feb. 2013 and there duly assigned Serial No. 10-2013-0018613.

BACKGROUND OF THE INVENTION

1. Field of the Invention

An aspect of the present invention generally relates to an organic light emitting display.

2. Description of the Related Art

Recently, there have been developed various types of flat panel displays capable of reducing the weight and volume of cathode ray tubes, which are disadvantageous. The flat panel displays include a liquid crystal display (LCD), a field emission display (FED), a plasma display panel (PDP), an organic light emitting display (OLED), and the like.

The above information disclosed in this Related Art section is only for enhancement of understanding of the background of the invention and therefore it may contain information that does not form the prior art that is already known to a person of ordinary skill in the art.

SUMMARY OF THE INVENTION

Embodiments provide an organic light emitting display capable of precisely controlling the voltage of output power and preventing the deterioration of the luminance of a display panel. These exemplary embodiments provided for an organic light emitting display capable of precisely controlling the voltage of output power and preventing the deterioration of the luminance of a display panel.

According to an aspect of the present invention, there is provided an organic light emitting display, including: a display panel including scan lines, data lines, first power lines and a plurality of pixels; a power supply positioned at the outside of the display panel, and supplying first power to the display panel through a coupling member; and the coupling member including first and second coupling portions respectively coupled to the power lines, first and second coupling lines transmitting the first power supplied from the power supply to the respective first and second coupling portions, and a feedback line transmitting the voltage of the second coupling portion to the power supply.

The power supply may control the output voltage of the first power, corresponding to the voltage transmitted from the feedback line.

The first coupling line may electrically couple between an output terminal of the power supply, to which the first power is output, and the first coupling portion, and the second coupling line may electrically couple between the output terminal of the power supply, to which the first power is output, and the second coupling portion.

The feedback line may electrically couple between a feedback terminal of the power supply and the second coupling portion.

The coupling member may be attached to a first region of the display panel.

The display panel may further include first and second power pads positioned on the one region, and respectively coupled to the first and second coupling portions.

The first power lines may be respectively coupled to the first and second power pads.

The length of the second coupling line may be longer than that of the first coupling line.

The power supply may be a DC-DC converter.

The coupling member may be a printed circuit board.

The coupling member may be a flexible printed circuit board.

The organic light emitting display may further include a scan driver supplying a scan signal to the pixels through the scan lines; and a data driver supplying a data signal to the pixels through the data lines.

As described above, according to the present invention, it is possible to provide an organic light emitting display capable of precisely controlling the voltage of output power and preventing the deterioration of the luminance of a display panel.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE EMBODIMENTS

OLED displays images use organic light emitting diodes that emit light through recombination of electrons and holes. The organic light emitting display has a fast response speed and is driven with low power consumption.

The OLED includes a display panel having a plurality of pixels to display an image, and a power supply supplying power to the display panel from the outside of the display panel through a flexible printed circuit board (FPCB) or the like.

The power supply generates power necessary for driving of the display panel by converting external power. In this case, power output to an output terminal of the power supply is fed back to the power supply in order to control the voltage of the output power.

However, a voltage drop is generated by the FPCB existing between the display panel and the power supply, and therefore, the voltage of power input to an actual display panel is lower than the output voltage of the power supply.

A voltage higher than the voltage of power used in the actual display panel is fed back to the related art power supply, and therefore, the power supply outputs power having a lower voltage than that of power required in the actual display panel. Accordingly, the luminance of the display panel is lower than target luminance.

Hereinafter, an organic light emitting display according to an embodiment of the present invention will be described with reference to the accompanying drawings.

Figure 1:
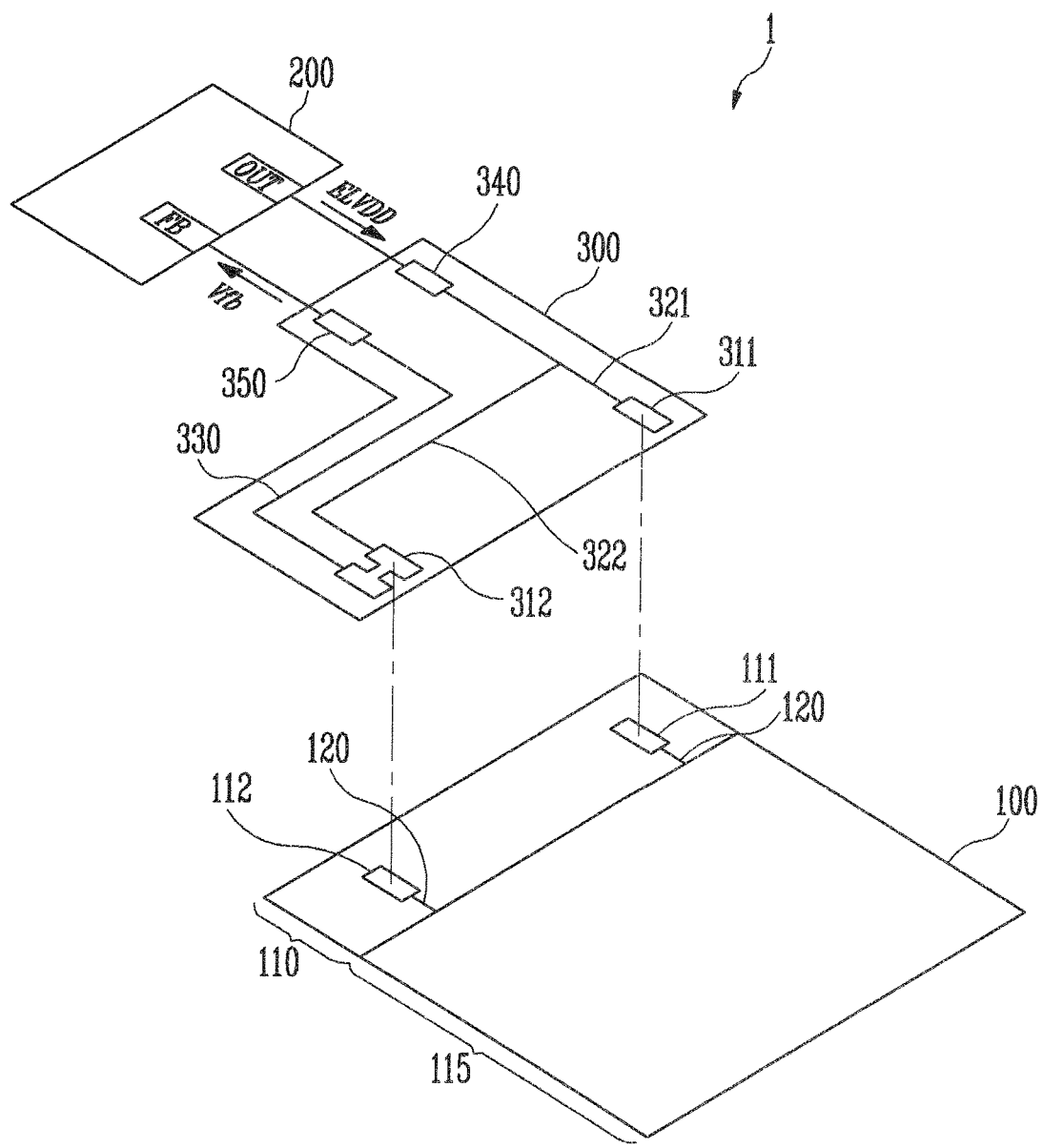
FIGS. 1 and 2 are views showing an organic light emitting display according to an embodiment of the present invention.
Figure 2:
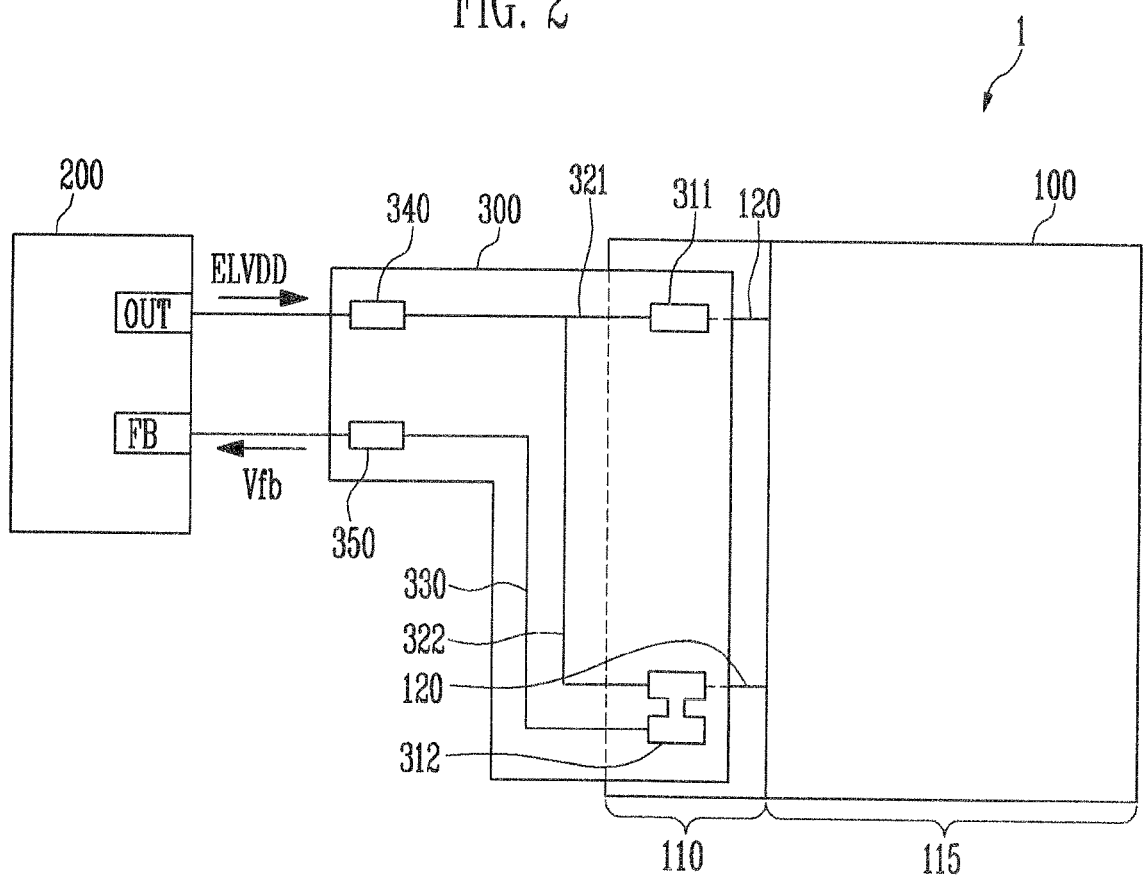

FIGS. 1 and 2 are views showing an organic light emitting display according to an embodiment of the present invention.

A display panel 100 is divided into two segments including a first region 110 and a second region 115.

Particularly, a state in which a coupling member 300 is separated from the display panel 100 is shown in FIG. 1, and a state in which the coupling member 300 is attached to the display panel is shown in FIG. 2.

Referring to FIGS. 1 and 2, the organic light emitting display 1 according to this embodiment includes the display panel 100, a power supply 200 and the coupling member 300.

The display panel 100 may include a plurality of pixels 140 (see FIG. 3) to display a predetermined image.

The display panel 100 may have first power lines for supplying a first power source ELVDD to the pixels 140.

The power supply 200 may be positioned at the outside of the display panel 100, so as to supply the first power source ELVDD to the display panel 100 through the coupling member 300.

The coupling member 300 may transmit the first power source ELVDD output from the power supply 200 to the display panel 100.

The coupling member 300 may allow the first power source ELVDD, in which a voltage drop is generated, to be fed back to the power supply 200.

To this end, the coupling member 300 may include a first coupling portion 311, a second coupling portion 312, a first coupling line 321, a second coupling line 322 and a feedback line 330.

The first and second coupling portions 311 and 312 may be electrically coupled to the respective power lines 120 of the display panel 100.

The first and second coupling lines 321 and 322 may transmit the first power source ELVDD supplied from the power supply 200 to the respective first and second coupling portions 311 and 312.

To this end, the first coupling line 321 may electrically couple between an output terminal OUT of the power supply 200, to which the first power source ELVDD is output, and the first coupling portion 311, and the second coupling line 322 may electrically couple between the output terminal OUT of the power supply 200, to which the first power source ELVDD is output, and the second coupling portion 312.

Accordingly, the first power source ELVDD output to the output terminal OUT of the power supply 200 can be transmitted to the first and second coupling portions 311 and 312 through the respective first and second coupling lines 321 and 322.

The first and second coupling lines 321 and 322 may be electrically coupled to the power supply 200 through a third coupling portion 340 included in the coupling member 300.

That is, the first coupling line 321 may be positioned between the first and third coupling portions 311 and 340, and the second coupling line 322 may be positioned between the second and third coupling portions 312 and 340.

In this case, one ends of the first and second coupling lines 321 and 322 are all coupled to the third coupling portion 340, and therefore, one end portions of the first and second coupling lines 321 and 322 may form one line as shown in FIG. 2.

Although it has been illustrated in FIG. 2 that the first and second coupling lines 321 and 322 are electrically coupled to the power supply 200 through the one third coupling portion 340, each of the first and second coupling lines 321 and 322 may be electrically coupled to the power supply 200 through a separate third coupling portion.

The feedback line 330 may transmit the voltage Vfb of the second coupling portion 312 to the power supply 200. Specifically, the feedback line 330 may transmit the voltage Vfb of the second coupling portion 312 to a feedback terminal FB of the power supply 200.

To this end, the feedback line 330 may electrically couple between the feedback terminal FB of the power supply 200 and the second coupling portion 312.

The feedback line 330 may be electrically coupled to the power supply 200 through a fourth coupling portion 350 included in the coupling member 300.

That is, the feedback line 330 may be positioned between the second and fourth coupling portions 312 and 350.

The power supply 200 may control the output voltage of the first power source ELVDD, corresponding to the voltage Vfb transmitted by the feedback line 330.

In this case, the voltage Vfb of the second coupling portion 312 may be fed back to the feedback terminal FB of the power supply 200 through the feedback line 330.

The voltage Vfb of the second coupling portion 312 is lower than the voltage of the first power source ELVDD output from the output terminal OUT of the power supply 200 due to the resistance of the second coupling line 322, etc.

In the present invention, the voltage Vfb obtained by reflecting the amount of voltage drop caused by the coupling member 300 can be fed back to the power supply 200 through the feedback line 330. Thus, it is possible to perform a precise control for the first power source ELVDD and to prevent the deterioration of the luminance of the display panel 100.

The coupling member 300 may be implemented as a printed circuit board (PCB) or flexible printed circuit board (FPCB).

In this case, the coupling member 300 may be attached to a first region 110 of the display panel 100 so as to be coupled to the first power line 120 existing in the display panel 100. This first region 110 is adjacent and connected to the second region 115.

The display panel 100 is positioned on the first region 110, and may further include first and second power pads 111 and 112 respectively coupled to the first and second coupling portions 311 and 312.

For example, in a case where the coupling member 300 is attached to the first region 110 of the display panel 100, the first power pad 111 may contact the first coupling portion 311, and the second power pad 112 may contact the second coupling portion 312.

In this case, the first power lines 120 are coupled to the respective first and second power pads 111 and 112, so that the first power source ELVDD supplied through the first and second power pads 111 and 112 can be transmitted to each pixel 140. In turn, the first power lines 120 are connected to the pixels 140 contained within the second region 115 of the display panel 100.

The power supply 200 may be a DC-DC converter that converts input power source Vin (see FIG. 5) supplied from the outside thereof into the first power source ELVDD.

In this case, the power supply 200 may be coupled to the coupling member 300 through a separate printed circuit board (not shown) in a state in which the power supply 200 is mounted on the printed circuit board (not shown).

To this end, the printed circuit board (not shown) having the power supply 200 mounted thereon may be coupled to the third and fourth coupling portions 340 and 350 of the coupling member 300.

The power supply 200 may be mounted immediately on the coupling member 300. In this case, the power supply 200 may be coupled immediately to the third and fourth coupling portions 340 and 350 of the coupling member 300.

According to the configuration described above, the output terminal OUT of the power supply 300 may be electrically coupled to the third coupling portion 340, the first coupling line 321, the second coupling line 322, the first coupling portion 311 and the second coupling portion 312.

The feedback terminal FB of the power supply 200 may be electrically coupled to the fourth coupling portion 350, the feedback line 330 and the second coupling portion 312.

As the length of a line increases, the amount of voltage drop increases. Therefore, in a case where the second coupling line 322 has a length longer than that of the first coupling line 321, the second coupling portion 312 has a lower voltage than that of the first coupling portion 311.

Therefore, the feedback line 330 is preferably coupled to the second coupling portion 312 having a lower voltage than that of the first coupling portion 311 so that the voltage having an amplitude maximally similar to that of power supplied to the display panel 100.

Figure 3:
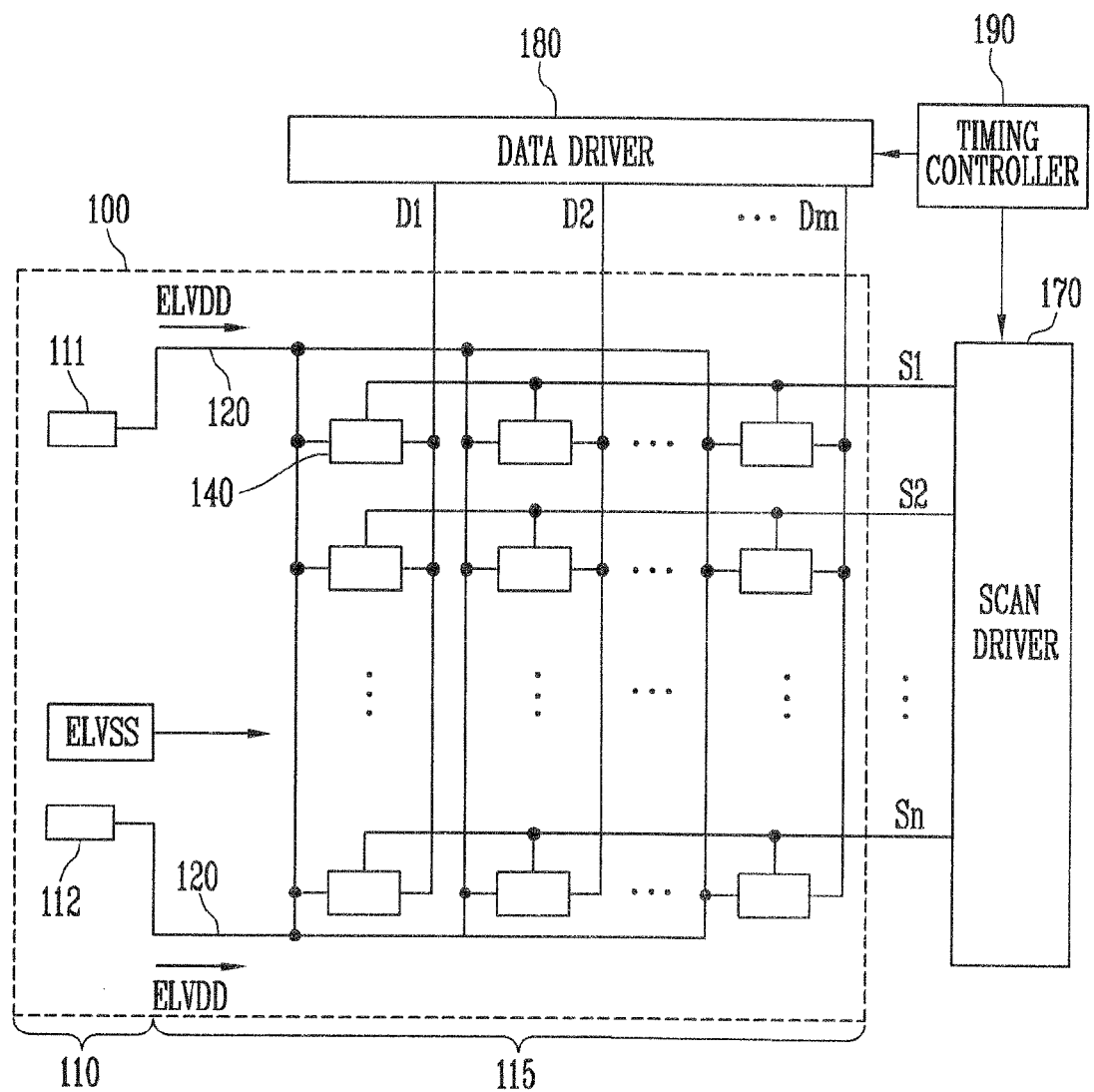
FIG. 3 is a block diagram showing a display panel according to the embodiment of the present invention.

FIG. 3 is a block diagram showing the display panel according to the embodiment of the present invention.

Referring to FIG. 3, the display panel 100 according to this embodiment may include scan lines S1 to Sn, data lines D1 to Dm, first power lines 120 and a plurality of pixels 140 coupled to the lines. As illustrated, the display panel 100 is divided into a one region 110 and a second region 115.

The organic light emitting display 1 according to this embodiment may further include a scan driver 170 supplying a scan signal to each pixel 140 through the scan lines S1 to Sn, a data driver 180 supplying a data signal to each pixel 140 through the data lines D1 to Dm, and a timing controller 190 controlling the scan driver 170 and the data driver 180.

The power supply 200 may be electrically coupled to the first and second power pads 111 and 112 existing in the display panel 100 through the coupling member 300.

The first power lines 120 are coupled to the respective first and second power pads 111 and 112 positioned on the first region 110 of the display panel 100, so as to transmit a first power source ELVDD to each pixel 140 contained in the second region 115.

Each pixel 140 receiving the first power source ELVDD and a second power source ELVSS may emit light corresponding to the data signal through current flowing from the first power source ELVDD to the second power source ELVSS via an organic light emitting diode.

The scan driver 170 may generate a scan signal under the control of the timing controller 190 and supply the generated scan signal to the scan lines S1 to Sn.

The data driver 180 may generate a data signal under the control of the timing controller 190 and supply the generated data signal to the data lines D1 to Dm.

If the scan signal is sequentially supplied to the scan lines S1 to Sn, pixels 140 are sequentially selected for each line, and the selected pixels 140 receive the data signal supplied from the data lines D1 to Dm.

The scan driver 170, the data driver 180 and the timing controller 190 may be positioned inside the display panel 100. For example, each of the scan driver 170, the data driver 180 and the timing controller 190 may be mounted directly on the display panel 100.

The scan driver 170, the data driver 180 and the timing controller 190 may be mounted to the display panel 100 from the outside of the display panel 100 through a separate coupling member (e.g., a PCB, FPCB, etc.).

Figure 4:
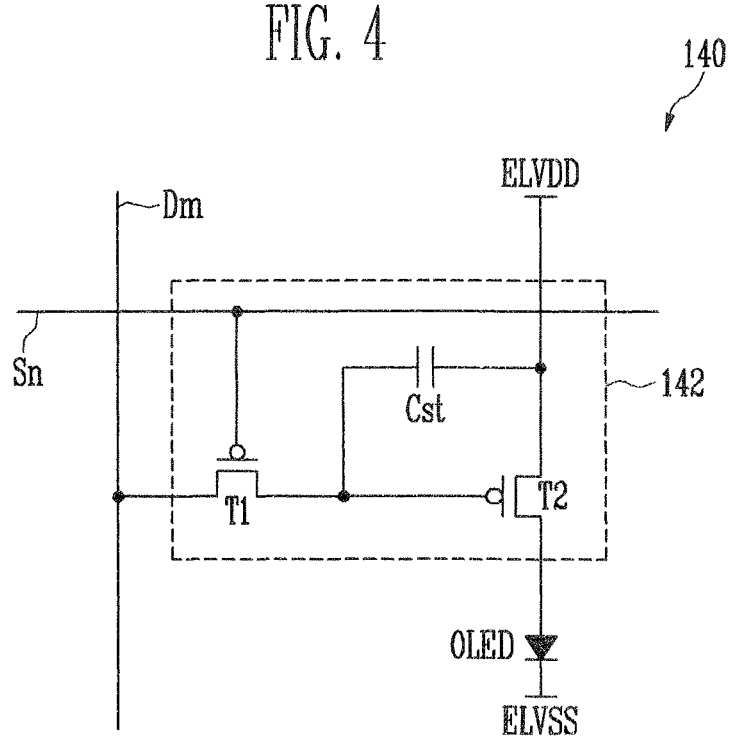
FIG. 4 is a circuit diagram showing an embodiment of a pixel shown in FIG. 3.

FIG. 4 is a circuit diagram showing an embodiment of the pixel shown in FIG. 3. Particularly, for convenience of illustration, a pixel coupled to an n-th scan line Sn and an m-th data line Dm is shown in FIG. 4.

Referring to FIG. 4, each pixel P includes an organic light emitting diode OLED, and a pixel circuit 142 coupled to the data line Dm and the scan line Sn so as to control the organic light emitting diode OLED.

An anode electrode of the organic light emitting diode OLED is coupled to the pixel circuit 142, and a cathode electrode of the organic light emitting diode OLED is coupled to a second power source ELVSS.

The organic light emitting diode OLED generates light with a predetermined luminance corresponding to current supplied from the pixel circuit 142.

The pixel circuit 142 may control the amount of current supplied to the organic light emitting diode OLED, corresponding to a data signal supplied to the data line Dm when a scan signal is supplied to the scan line Sn.

To this end, the pixel circuit 142 includes a second transistor T2 coupled between a first power source ELVDD and the organic light emitting diode OLED, a first transistor T2 coupled among the second transistor T2, the data line Dm and the scan line Sn, and a storage capacitor Cst coupled between a gate electrode and a first electrode of the second transistor T2.

A gate electrode of the first transistor T1 is coupled to the scan line Sn, and a first electrode of the first transistor T1 is coupled to the data line Dm.

A second electrode of the first transistor T1 is coupled to one terminal of the storage capacitor Cst.

Here, the first electrode is set as any one of source and drain electrodes, and the second electrode is set as an electrode different from the first electrode. For example, if the first electrode is set as the source electrode, the second electrode is set as the drain electrode.

When the scan signal is supplied from the scan line Sn, the first transistor T1 coupled to the scan line Sn and the data line Dm is turned on to supply the data signal supplied from the data line Dm to the storage capacitor Cst. In this case, the storage capacitor Cst charges a voltage corresponding to the data signal.

The gate electrode of the second transistor T2 is coupled to the one terminal of the storage capacitor Cst, and the first electrode of the second transistor T2 is coupled to the other terminal of the storage capacitor Cst and the first power source ELVDD. A second electrode of the second transistor T2 is coupled to the anode electrode of the organic light emitting diode OLED.

The second transistor T2 controls the amount of current flowing from the first power source ELVDD to the second power source ELVSS via the organic light emitting diode OLED, corresponding to the voltage stored in the storage capacitor Cst. In this case, the organic light emitting diode OLED generates light corresponding to the amount of current supplied from the second transistor T2.

The structure of the pixel of FIG. 4 described above is merely one embodiment of the present invention, and therefore, the pixel 140 of the present invention is not limited to the structure of the pixel. Practically, the pixel circuit 142 has the structure of a circuit capable of supplying current to the organic light emitting diode OLED, and may be selected as any one of various structures currently known in the art.

The second power source ELVSS supplied, together with the first power source ELVDD, to each pixel 140 may be generated by a separate power supply (not shown). The second power source ELVSS may be supplied to each pixel 140 in the same manner as the first power source ELVDD.

In this case, the first power source ELVDD may be set to a positive voltage, and the second power source ELVSS may be set to a negative voltage.

Figure 5:
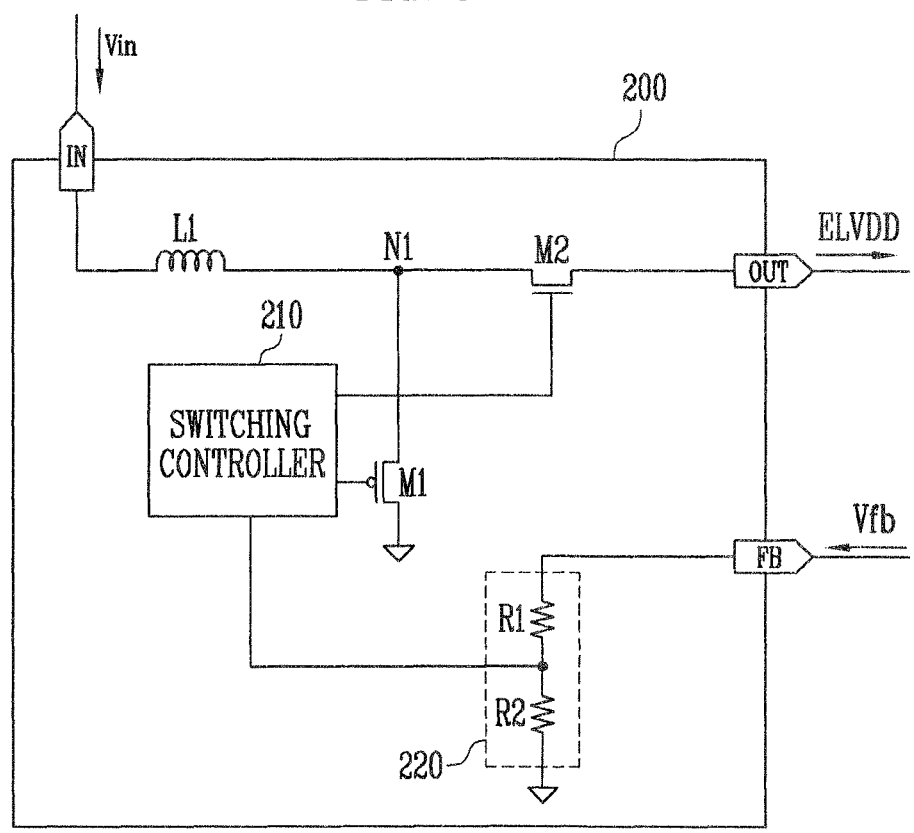
FIG. 5 is a circuit diagram showing a power supply according to the embodiment of the present invention.

FIG. 5 is a circuit diagram showing the power supply according to the embodiment of the present invention.

Referring to FIG. 5, the power supply 200 according to this embodiment may be implemented as a boost-type DC-DC converter.

The power supply 200 according to this embodiment may receive input power source Vin supplied to an input terminal IN so as to generate a first power source ELVDD, and output the first power source ELVDD to an output terminal OUT.

The power supply 200 may receive a voltage Vfb transmitted from the feedback line 330 through the feedback terminal FB.

For example, the power supply 200 may include an inductor L1, a first transistor M1, a second transistor M2, a switching controller 210 and a voltage divider 220.

The inductor L1 is coupled between the input terminal IN and a first node N1.

The first transistor M1 is coupled between the first node N1 and ground power source.

The second transistor M2 is coupled between the first node N1 and the output terminal OUT.

The switching controller 210 may control the first and second transistors M1 and M2. The switching controller 210 controls on-off operations of the first and second transistors M1 and M2, so that the input power source Vin can be converted into the first power source ELVDD having a desired voltage level.

The voltage divider 220 may divide the voltage Vfb input from the feedback terminal FB and supply the divided voltage to the switching controller 210.

For example, the voltage divider 220 may be configured with a plurality of resistors (e.g., R1 and R2) coupled in series.

The switching controller 210 receiving the voltage divided by the voltage divider 220 controls the duty ratio of the first and second transistors M1 and M2, corresponding to the divided voltage, thereby generating desired first power source ELVDD.

In this case, the first and second transistors M1 and M2 may be alternately turned on. Accordingly, the first and second transistors M1 and M2 may be formed to have different conductive types. For example, if the first transistor M1 is formed to have a P-type, the second transistor M2 may be formed to have an N-type.

The circuit structure of FIG. 5 described above is merely one embodiment of the present invention, and therefore, the power supply 200 of the present invention is not limited to the circuit structure. Practically, the power supply 200 may be modified into various circuit structures capable of generating the first power source ELVDD.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display, comprising:
   a display panel including scan lines, data lines, first power lines and a plurality of pixels; and
   a power supply positioned at the outside of the display panel, and supplying first power to the display panel through a coupling member,
   the coupling member including
      first and second coupling portions respectively coupled to the first power lines,
      first and second coupling lines transmitting the first power supplied from the power supply to the respective first and second coupling portions, and
      a feedback line electrically coupling a feedback terminal of the power supply and the second coupling portion,
      the voltage of the second coupling portion dropped at the second coupling line being fed back to the power supply through the feedback line.

2. The organic light emitting display of claim 1, the first coupling line electrically coupling an output terminal of the power supply, to which the first power is output, and the first coupling portion, and
   the second coupling line electrically coupling the output terminal of the power supply, to which the first power is output, and the second coupling portion.

3. The organic light emitting display of claim 1, the coupling member being attached to a first region of the display panel.

4. The organic light emitting display of claim 3, the display panel further including first and second power pads positioned on the first region, and respectively coupled to the first and second coupling portions.

5. The organic light emitting display of claim 4, the first power lines being respectively coupled to the first and second power pads.

6. The organic light emitting display of claim 1, the length of the second coupling line being longer than that of the first coupling line.

7. The organic light emitting display of claim 1, the power supply being a DC-DC converter.

8. The organic light emitting display of claim 1, the coupling member being a printed circuit board.

9. The organic light emitting display of claim 1, the coupling member being a flexible printed circuit board.

10. The organic light emitting display of claim 1, further comprising:
    a scan driver supplying a scan signal to the pixels through the scan lines; and
    a data driver supplying a data signal to the pixels through the data lines.

11. An organic light emitting display (OLED), comprising:
    a display panel having a first region and a second region, said first region containing a first and second pads and said second region containing a plurality of pixels;
    a first power line electrically connecting the first and second pads and the plurality of pixels;
    a coupling member overlapping the first region of the display panel having a first and second coupling portions electrically connected to the first and second pads and a feedback line connected to the second coupling portion;
    a power supply external to and separated from the display panel and the coupling member, said power supply electrically connected to the coupling member supplying first power to the display panel, said feedback line transmitting the voltage of the second coupling portion to the power supply, and the power supply controlling an output voltage of the first power, corresponding to the voltage transmitted from the feedback line,
    an amount of voltage drop caused by the coupling member is compensated for maintaining a luminance of the display panel.

12. The OLED recited in claim 11, further comprising:
    a first coupling line electrically coupling an output terminal of the power supply, to which the first power is output, and the first coupling portion; and a second coupling line electrically coupling the output terminal of the power supply, to which the first power is output, and the second coupling portion.

13. The OLED recited in claim 11, the feedback line electrically coupling a feedback terminal of the power supply and the second coupling portion.

14. The OLED recited in claim 12, a length of the second coupling line being longer than that of the first coupling line.

15. The OLED recited in claim 11, the power supply being a DC-DC converter.

16. The OLED recited in claim 11, the coupling member being a printed circuit board.

17. The OLED recited in claim 11, the coupling member being a flexible printed circuit board.

18. The OLED recited in claim 11, further comprising:
   a scan driver supplying a scan signal to the plurality pixels through scan lines; and
   a data driver supplying a data signal to the plurality of pixels through data lines.

* * * * *